(12) United States Patent
Frank et al.

(10) Patent No.: US 6,225,135 B1
(45) Date of Patent: May 1, 2001

(54) IN-SITU METHOD FOR REAL TIME MONITORING OF CHEMICAL BATHS FOR TRANSITION METALS WITH MULTI-CHANNEL ELECTRODES

(75) Inventors: Aaron L. Frank; Jennifer S. Obeng; Yaw S. Obeng, all of Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/322,445

(22) Filed: May 28, 1999

(51) Int. Cl.[7] .................................................. H01L 21/66
(52) U.S. Cl. ............................................................. 438/14
(58) Field of Search .................................. 438/14, 15–18, 438/800; 204/153.1, 409, 406, 434, 412

(56) References Cited

U.S. PATENT DOCUMENTS 5,364,510  *  11/1994  Carpio ............................. 204/153.1

OTHER PUBLICATIONS

G. Compton and P.R. Unwin; "The Dissolution of Calcite in Aqueous Solution pH<4: Kinetics and Mechanism"; Phil. Trans. R. Soc. Lond. vol. 330; 1990; pp. 1–45.

R. G. Compton & A. Hamnett; "The Use of Channel Electrodes in the Investigation of Interfacial Reaction Mechanisms"; vol. 29—New Techniquest for the Study of Electrodes and Their Reactions; 1989; pp. 173–296.

* cited by examiner

Primary Examiner—Chandra Chaudhari
Assistant Examiner—Craig Thompson

(57) ABSTRACT

The present invention provides an electrolytic cell for use in a process for real time monitoring of a chemical bath used in the fabrication of a semiconductor wafer and having different metal ions therein. In one embodiment, the electrolytic cell comprises a fluid chamber having an inlet, an outlet and chamber walls, and channel electrodes coupled to the chamber walls. The inlet and outlet permit a throughflow of at least of a portion of the chemical bath. Each of the channel electrodes corresponds to one of the different metal ions. Each channel electrode is energized to a detection potential selected to provide electrical conduction when the corresponding different metal ion reaches a prescribed concentration.

14 Claims, 2 Drawing Sheets

IN-SITU METHOD FOR REAL TIME MONITORING OF CHEMICAL BATHS FOR TRANSITION METALS WITH MULTI-CHANNEL ELECTRODES

TECHNICAL FIELD OF THE INVENTION

The present invention is directed, in general, to a sensor for real time monitoring of chemical baths used in the fabrication of semiconductor devices and, more specifically, to an electrolytic cell having channel electrodes coupled thereto that are capable of monitoring the presence of transition metals in chemical baths used in the fabrication of semiconductor devices and a method of use therefore.

BACKGROUND OF THE INVENTION

The manufacturing of semiconductors regularly employs the use of chemical solvent baths, i.e., acids, bases and organic solvents, for both cleaning the semiconductor wafer and removing unneeded portions of layers, e.g., photolithographic masks, formed during an intermediate process. Especially in acids or strong bases, certain transition metals, such as copper (Cu), iron (Fe), and zinc (Zn) may be soluble as ions in the solvents used. Unfortunately, traces of these metals in an acid etch or solvent cleaning solution can precipitate onto critical areas of the semiconductor wafer during processing, resulting in failure of the integrated circuit. As the concentration of a particular metal ion increases in the solvent, the likelihood of contamination of the wafer increases. Heretofore, the only available method of monitoring metal ion concentration in the solvent has been by sampling the solvent and analyzing the sample ex situ, while the processing of semiconductor wafers continues. The major problem with this procedure is that the wafers processed while the solvent testing is being performed are at risk of contamination and failure.

Historically, copper has not been a major problem in it semiconductor manufacturing. Aluminum (Al) has been the metal of choice in the formation of interconnectivity traces in the semiconductor back-end. It was only recently that the problems associated with using copper in semiconductor manufacturing were solved. However, with the recent advances in copper technology, the movement in the industry will certainly be toward greater use of copper because of its superior conductive properties over aluminum. Therefore, any metal ion monitoring method must address the introduction of copper to semiconductor manufacture.

Accordingly, what is needed in the art is an in situ, real time, monitoring system for transition metals in semiconductor processing chemical baths.

SUMMARY OF THE INVENTION

To address the above-discussed deficiencies of the prior art, the present invention provides an electrolytic cell for use in a process for real time monitoring of a chemical bath used in the fabrication of a semiconductor wafer and having different metal ions therein. In one embodiment, the electrolytic cell comprises a fluid chamber having an inlet, an outlet and chamber walls, and channel electrodes coupled to the chamber walls. The inlet and outlet permit a throughflow of at least of a portion of the chemical bath. Each of the channel electrodes corresponds to one of the different metal ions. Each channel electrode is energized to a detection potential selected to provide electrical conduction when the corresponding different metal ion reaches a prescribed concentration.

In an alternative embodiment, at least one of the channel electrodes further comprises an ion-selective film formed on the channel electrode; the ion-selective film being capable of capturing the metal ion from the chemical bath. In such embodiments, the ion-selective film may further comprise a receptor molecule formed on a surface of the channel electrode. In a one particular embodiment, the receptor molecule may be a derivative of 2,2'-trichorosilane-bisalkyl acetoacetonate having the general formula: $Cl_3Si[CH_2(CH_2)_n-O-C(O)CH_2C(O)CH_3]_2$. The receptor molecule, in a more specific embodiment, may be 2,2'trichlorosilane-bisethyl acetoacetonate or 2,2'-silobisethyl acetoacetonate. It is believed that the receptor molecule captures the metal ion by way of dative bonding.

In another embodiment, the ion-selective film further comprises a surface sealing component. For example, the surface sealing component may be an organic fatty acid having the general formula of $C_nH_{2n+1}COOH$, where n is equal to or greater than 4, or an n-alkyl trichlorosilane having the general formula $C_nH_{2n+1}SiCl_3$.

The metal ion, may be an $M^{2+}$ or $M^{3+}$ metal ion. In a particular embodiment, the metal ion is an $M^{2+}$ metal ion selected from the group consisting of $Cu^{2+}$, $Zn^{2+}$, or $Cd^{2+}$. In another embodiment, the metal ion may be an $M^{3+}$ metal ion selected from the group consisting of $Fe^{3+}$ or $Ce^{3+}$.

In an alternative embodiment, the channel electrode is an inert electrode selected from the group consisting of: platinum, glassy carbon, or n-type silicon. In yet another embodiment, the electrolytic cell further comprises electrical connectors that connect each of the channel electrodes to an analyzer capable of determining a concentration of at least one of the metal ions in the chemical bath as a function of the current.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
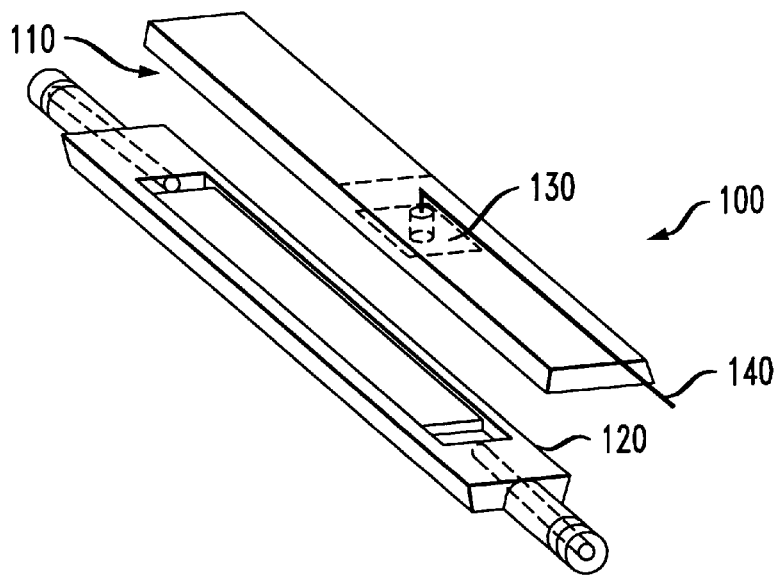
FIG. 1 illustrates an exploded isometric view of a conventional channel electrode mounted in a wall of a channel.

Referring initially to FIG. 1, illustrated is an exploded isometric view of a conventional channel electrode 100 mounted in a wall 110 of a channel 120. For semiconductor applications, the conventional channel electrode 100 may comprise a thin, flat, rectangular plate 130 and an electrical lead 140. The rectangular plate 130 is mounted flush in the wall 110 so that fluid flow across the rectangular plate 130 is laminar. The electrical lead 140 connects the channel electrode 100 to an analyzer (not shown).

Figure 2:
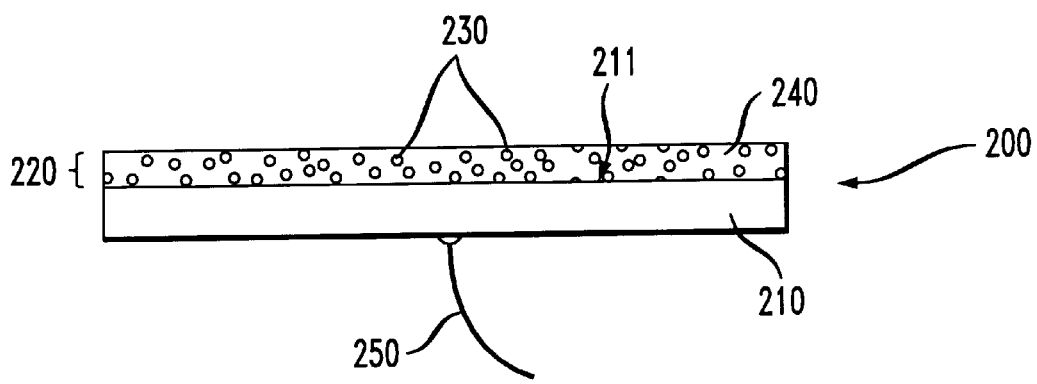
FIG. 2 illustrates a sectional view of one embodiment of a channel electrode constructed according to the principles of the present invention.

Referring now to FIG. 2, illustrated is a sectional view of one embodiment of a channel electrode constructed according to the principles of the present invention. A channel electrode 200 comprises a thin, flat, rectangular plate 210, a film 220, and an electrical lead 250. The film 220, which may comprise a receptor molecule 230 and a surface sealing component 240, is formed on the rectangular plate 210 on a surface 211 that will be proximate a chemical bath. The electrical lead 250 provides the necessary electrical connectivity of the channel electrode 200 to an analyzer (not shown).

In one advantageous embodiment, the rectangular plate 210 may comprise a suitable unmodified, inert electrode material such as: platinum, glassy carbon, or n-type silicon. These materials are suitable for applications wherein a sample (test solution) of the chemical bath is circulated back to the chemical bath. Alternatively, if the sample can be isolated from the chemical bath, the channel electrodes 200 may be made of chemically modified gold, silver, or copper. The film 220 may be modified by incorporating ion-selective receptor molecules 230 selected for their affinity for a class of metal ions, e.g., $M^{2+}$, or specific metal ions, e.g., $Cu^{2+}$, $Zn^{2+}$, or $Cd^{2+}$.

In preparation for forming the film 220, the rectangular plate 210 may be thoroughly cleaned with a dry simple alcohol, such as 1 ethanol or propanol. The film 220 may be formed by applying to the plate 210 a solution (not shown) comprising derivatives of 2,2'-trichorosilane-bisalkyl acetoacetonate having a general formula: $Cl_3Si[CH_2(CH_2)_n—O—C(O)CH_2C(O)CH_3]_2$ that constitute the receptor molecules 230 and the surface sealing component 240. In specific embodiments, the receptor molecule 230 derivatives may be 2,2'trichlorosilane-bisethyl acetoacetonate when n=2, or alternatively 2,2'-silobisethyl acetoacetonate. The surface sealing component 240 may be an organic fatty acid having the general formula of $C_nH_{2n+1}COOH$, where n is equal to or greater than 4, or an n-alkyl trichlorosilane having the general formula $C_nH_{2n+1}SiCl_3$. In a specific embodiment, for n=18, the n-alkyl trichlorosilane is n-octadecyl trichlorosilane (OTS). To assure deposition of the film 220, the solution may be heated to about 50° C. for a period ranging from about 1 minute to about 60 minutes, and preferably for about 30 minutes. It should be noted that although the previous discussion has been directed to receptor modules specific to $M^{2+}$ ions, for example: $Cu^{2+}$, $Zn^{2+}$, or $Cd^{2+}$, a similar approach may be used to construct the channel electrode 200 with other receptor molecules 230 specific to $M^{3+}$ ions, e.g., $Fe^{3+}$ or $Ce^{3+}$.

Figure 3:
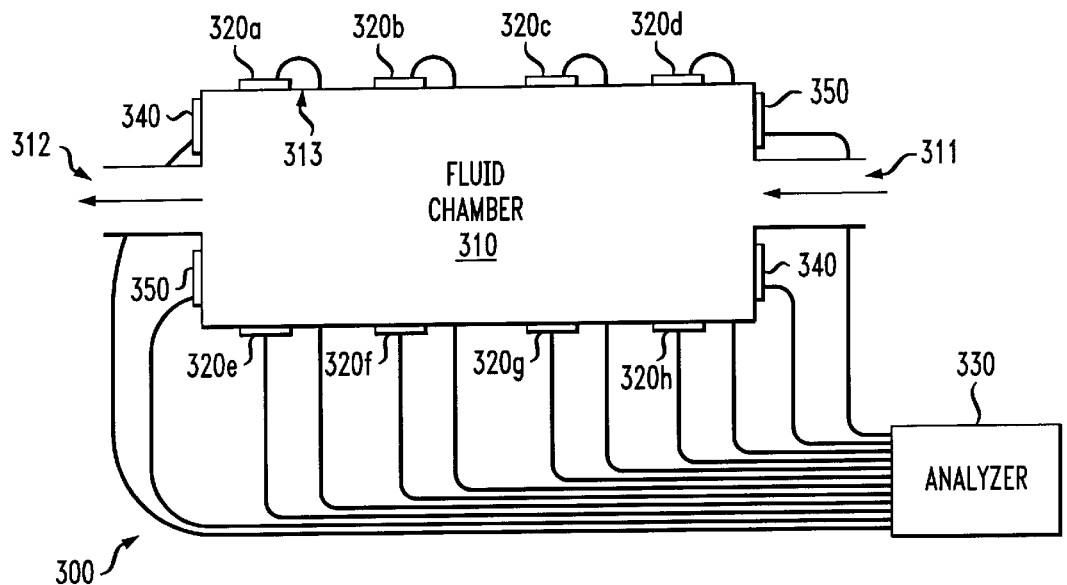
FIG. 3 illustrates a sectional view of one embodiment of an electrolytic cell constructed according to the principles of the present invention.

Referring now to FIG. 3, illustrated is a sectional view of one embodiment of an electrolytic cell constructed according to the principles of the present invention. An electrolytic cell 300 comprises a fluid chamber 310 and channel electrodes, generally designated 320, and individually designated 320a–320h. The fluid chamber 310 has an inlet 311, an outlet 312, and chamber walls 313 to which the channel electrodes 320 are coupled. The electrolytic cell may be adapted to be located in the bath reservoir. However, it is preferably located on an outside wall of the bath, which provides a more isolated environment for more accurate readings.

Each of the channel electrodes 320a–320h may be electrically coupled to an analyzer 330 and selectively energized to a detection potential ($V_a$–$V_h$) corresponding to a specific transition metal ion, e.g., $Cu^{2+}$, $Zn^{2+}$, $Cd^{2+}$, $Fe^{3+}$ or $Ce^{3+}$, that is to be detected. In one embodiment, each channel electrode 320a–320h may be selected and energized to detect a different specific ion, e.g., $Cu^{2+}$, $Zn^{2+}$, $Cd^{2+}$, $Fe^{3+}$ or $Ce^{3+}$. However, one who is skilled in the art will recognize that in an alternative embodiment, two or more electrodes may be selected and energized to detect the same specific ion if so desired. The detection potential of each channel electrode 320a–320h is chosen by considering a combination of parameters, specifically: (a) the physical and chemical characteristics of the selected metal ion to be detected, (b) a maximum acceptable ion concentration of the selected metal ion in a chemical bath, and (c) the potential required to cause current flow at the maximum acceptable ion concentration. One who is skilled in the art is familiar with the use of electrochemistry to analyze chemical baths with channel electrodes and an analyzer. The electrolytic cell 300 may further comprise one or more counter electrodes 340 and reference electrodes 350. For details of the general theory and operation of channel electrodes 320, counter electrodes 340, and reference electrodes 350, one who is skilled in the art is referred to: "The Use of Channel Electrodes in the Investigation of Interfacial Reaction Mechanism in Chemical Kinetics", Vol. 29, by P. R. Unwin and R. G. Compton, edited by R. G. Compton and published by Elsevier, Amsterdam, which is incorporated herein by reference.

Figure 4:
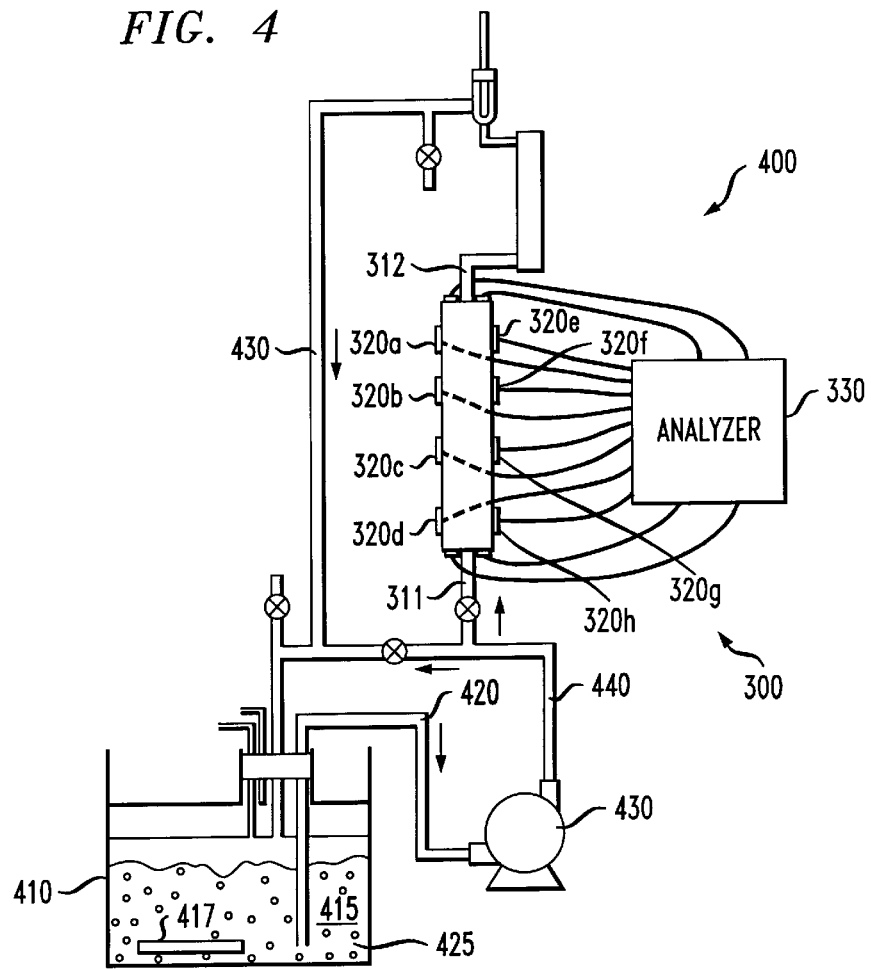
FIG. 4 illustrates a simplified schematic diagram of one embodiment of an in situ ion analyzer system employing the electrolytic cell of FIG. 3.

Referring now to FIG. 4, illustrated is a simplified schematic diagram of one embodiment of an in situ ion analyzer system employing the electrolytic cell of FIG. 3. An in situ ion analyzer system 400 comprises a chemical bath reservoir 410, reservoir-to-pump conduit 420, a pump 430, pump-to-cell conduit 440, an electrolytic cell 300, an analyzer 330, and cell-to-reservoir conduit 430. The electrolytic cell 300 comprises an inlet 311, an outlet 312, multiple channel electrodes 320a–320h, counter electrodes 340, and reference electrodes 350. The inlet 311 and outlet 312 of the electrolytic cell 300 permit throughflow of at least a portion of a chemical bath 415 used to process a semiconductor wafer 417. The semiconductor wafer 417 may be subjected to a variety of specific processes, such as: etching, cleaning, removing unneeded portions of photolithographic masks, etc. One who is skilled in the art will recognize that the present invention is applicable to any semiconductor process that employs a chemical bath. The chemical bath 415 may be acidic, basic or organic in nature. The principles of the present invention may be appropriately tailored to accommodate such variations.

During semiconductor processing and particularly in back-end processes, the wafer 417 is subjected to a chemical bath 415. At least a portion of the chemical bath 415 is pumped from the reservoir 410 through the reservoir-to-pump conduit 420, pump 430, pump-to-cell conduit 440, the electrolytic cell 300, the cell-to-reservoir conduit 430, and back to the reservoir 410 by the pump 430.

The individual channel electrodes 320a–320h may be custom designed to detect a specific ion, e.g. $Cu^{2+}$, $Zn^{2+}$, $Cd^{2+}$, $Fe^{3+}$ or $Ce^{3+}$, or class of ions, e.g. $M^{2+}$ or $M^{3+}$. In one embodiment, there may be a one-to-one relationship between specific ions, or classes of ions, and the number of channel electrodes. However, it is also envisioned that in other embodiments, more than one electrode may be set to detect a specific ion or class of ions. When the chemical bath 415 passes through the electrolytic cell 300, the bath 415 acts upon the channel electrodes 320a–320h. Individual ions are collected by the ion-selective receptor molecules 230 (FIG. 2). It is sufficient for this discussion to note that the channel electrodes 320a–320h may be individually set to selected electrical potentials that are known to conduct electrical current when a threshold level of a specific ion sought is met or exceeded. Therefore, having tailored the individual channel electrodes 320a–320h with a film 220 specifically engineered to capture target ions 425 of specific sizes and charge, for example, $Cu^{2+}$, $Fe^{3+}$, etc., the individual channel electrodes 320a–320h will conduct current when the specified threshold level of the specific ion sought is met or exceeded. The conduction of current is detected by the analyzer 330 in situ, thus providing real-time monitoring of the chemical bath 415 for the desired transition metal ions.

When exposed to a concentration of the target ions 425 in solution 415 during processing of semiconductor wafers 417, the target ions 425 bind with the receptor molecules 230 via dative bonding or coordination bonding. For example, the receptor molecules 230 and surface sealing component 240 detailed above will adsorb $M^{2+}$ ions, specifically $Cu^{2+}$, $Zn^{2+}$, and $Cd^{2+}$. The film 220 may be engineered to accept a whole class of metal ions, e.g., $M^{2+}$ but not $M^{3+}$, or only specific ions, such as $Cu^{2+}$.

Therefore, an electrolytic cell 300 employing multichannel electrodes 320 has been described that when coupled to an analyzer 330 enables real time sensing of the ion concentration of a specific ion 425 or class of ions present in a semiconductor chemical bath 415. Allowable thresholds for each ion 425 or class of ions may be specified for changing the chemical bath 415 to prevent deposition of metals on a semiconductor wafer 417 which might cause device failure.

Although the present invention has been described in detail, those skilled in the art should understand that they can make various changes, substitutions and alterations herein without departing from the spirit and scope of the invention in its broadest form.

What is claimed is:

1. A method for fabricating a semiconductor wafer, comprising:
    monitoring a chemical bath into which said semiconductor wafer is to be placed, said chemical bath having different metal ions therein by:
        flowing at least a portion of said chemical bath through an electrolytic cell having channel electrodes mounted thereon, one of said channel electrodes corresponding to one of said different metal ions and is energized to a detection potential selected to provide electrical conduction when said one of said different metal ion reaches a prescribed concentration; and
        measuring a concentration of at least one of said different metal ions with at least one of said channel electrodes;
    placing said semiconductor wafer in said chemical bath if said concentration is within an acceptable range;
    changing said chemical bath prior to placing said semiconductor wafer in said chemical bath if said concentration is above said acceptable range; and
    completing formation of said semiconductor wafer.

2. The method as recited in claim 1 wherein mounting further includes forming an ion-selective film on a surface of said channel electrode, and measuring further includes capturing at least one of said different metal ions on said film.

3. The method as recited in claim 2 wherein capturing said at least one of said different metal ions is by dative bonding.

4. The method as recited in claim 2 wherein forming includes forming a receptor molecule in said ion-selective film, said receptor molecule being a derivative of 2,2'-trichorosilanebisalkyl acetoacetonate having the general formula:

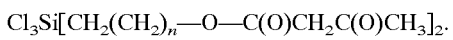

5. The method as recited in claim 4 wherein forming a receptor molecule includes forming a receptor molecule of 2,2'trichlorosilane-bisethyl acetoacetonate or 2,2'-silobisethyl acetoacetonate.

6. The method as recited in claim 2 wherein forming an ion-selective film further comprises applying a surface sealing component to said ion-selective film.

7. The method as recited in claim 6 wherein applying a surface sealing component includes applying a surface sealing component comprising an organic fatty acid having the general formula of $C_nH_{2n+1}COOH$, where n is equal to or greater than 4, or an n-alkyl trichlorosilane having the general formula $C_nH_{2n+1}SiCl_3$.

8. The method as recited in claim 1 wherein measuring includes measuring a metal ion that is an $M^{2+}$ or $M^{3+}$ metal ion.

9. The method as recited in claim 8 wherein measuring a metal ion includes measuring an $M^{2+}$ metal ion selected from the group consisting of:
    $Cu^{2+}$,
    $Zn^{2+}$, and
    $Cd^{2+}$.

10. The method as recited in claim 8 wherein measuring a metal ion includes measuring an $M^{3+}$ metal ion selected from the group consisting of:
    $Fe^{3+}$, and
    $Ce^{3+}$.

11. The method as recited in claim 1 wherein mounting includes mounting at least one channel electrode that is an inert electrode selected from the group consisting of:
    platinum;
    glassy carbon; and
    n-type silicon.

12. The method as recited in claim 1 wherein mounting includes mounting at least one channel electrode that is a chemically modified electrode selected from the group consisting of:
    gold;
    silver; and
    copper.

13. The method as recited in claim 1 further comprising coupling electrical connectors from each of said channel electrodes to an analyzer and said measuring includes determining a concentration of at least one of said metal ions in said chemical bath as a function of an electrical current flowing in at least one of said channel electrodes detected by said analyzer.

14. The method as recited in claim 1 wherein each of said channel electrodes corresponds to a different metal ion and is energized to a detection potential selected to provide electrical conduction when said different metal ion reaches a prescribed concentration.

* * * * *